(12) United States Patent
Goldberg

(10) Patent No.: US 8,385,382 B2
(45) Date of Patent: Feb. 26, 2013

(54) COMPACT MULTI-WAVELENGTH AND MULTI-BEAM LASER

(75) Inventor: Lew Goldberg, Fairfax, VA (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 120 days.

(21) Appl. No.: 13/053,422

(22) Filed: Mar. 22, 2011

(65) Prior Publication Data

US 2012/0243563 A1 Sep. 27, 2012

(51) Int. Cl.
*H01S 3/082* (2006.01)

(52) U.S. Cl. ............... 372/97; 372/99; 372/92; 372/108; 372/23; 372/71; 372/41

(58) Field of Classification Search .................... 372/97, 372/99, 92, 108, 23, 71, 41
See application file for complete search history.

(56) References Cited

U.S. PATENT DOCUMENTS

| 4,494,235 | A | | 1/1985 | Guch, Jr. et al. | |
|---|---|---|---|---|---|
| 5,299,222 | A | | 3/1994 | Shannon et al. | |
| 5,321,711 | A | * | 6/1994 | Rapoport et al. | 372/41 |
| 5,331,649 | A | * | 7/1994 | Dacquay et al. | 372/23 |
| 5,675,595 | A | * | 10/1997 | Jani | 372/23 |
| 7,356,061 | B2 | | 4/2008 | Kondo | |
| 2007/0104431 | A1 | | 5/2007 | Di Teodoro et al. | |

* cited by examiner

*Primary Examiner* — Kinam Park
(74) *Attorney, Agent, or Firm* — Richard J. Kim

(57) ABSTRACT

A compact solid state laser that generates multiple wavelengths and multiple beams that are parallel, i.e., bore-sighted relative to each other, is disclosed. Each of the multiple laser beams can be at a different wavelength, pulse energy, pulse length, repetition rate and average power. Each of the laser beams can be turned on or off independently. The laser is comprised of an optically segmented gain section, common laser resonator with common surface segmented cavity mirrors, optically segmented pump laser, and different intracavity elements in each laser segment.

8 Claims, 4 Drawing Sheets

COMPACT MULTI-WAVELENGTH AND MULTI-BEAM LASER

GOVERNMENT INTEREST

The invention described herein may be manufactured, used, sold, imported, and/or licensed by or for the Government of the United States of America.

FIELD OF THE INVENTION

This invention relates in general to lasers, and more particularly, to multi wavelength and multi-beam lasers.

BACKGROUND OF THE INVENTION

Specific laser applications such as laser designation, laser range-finding, laser illumination, and laser marking and pulsed illuminators for active imaging require separate laser devices, each optimized for the corresponding use. Each laser device typically comes with its own housing, electronics and power supply/batteries. Although a wavelength, multipurpose laser could be constructed by integrating these laser devices into a single system, the use of many separate sets of housing, electronics and power supplies would result in a system that is complex, heavy and bulky. In addition, such integration approach would require using multiple telescopes, one for every laser in the system, or the combining of outputs of all lasers into a single beam, to be transmitted through a single telescope. Both of these methods would require careful bore-sighting of all of the beams relative to each other, and maintaining such alignment over a large military-spec temperature range and vibration and shock exposure. The need for such beam combiner and/or multiple telescopes would further add to the complexity, weight and size of the multi-wavelength laser system. These deficiencies would make a multi-wavelength laser system that is comprised of separate individual lasers too large and complex to be useful. This is particularly true when a laser system needs to be hand-held, rifle-mounted or be mounted in a small unmanned air vehicles (UAVs) and unmanned ground vehicles (GUVs).

U.S. Pat. No. 5,675,595 relates to a composite multiple wavelength laser material and multiple wavelength laser for use therewith; U.S. Pat. No. 4,494,235 relates to a multiple wavelength laser; and U.S. Pat. No. 5,331,649 relates to a multiple wavelength laser system. These patents do not teach generating multiple beams with different wavelengths, pulse energies, pulse repetition rates, Further, they are not known to teach control of the output energy and power of each laser independently.

SUMMARY OF THE INVENTION

In one aspect, a compact multi-wavelength and multi-beam laser is disclosed. Such a multi-wavelength and multi-beam laser comprises an optically segmented composite gain medium; a single common laser resonator defined by a first common surface minor and a second common surface mirror, at least one of said common surface minors being configured as a common surface segmented mirror; a segmented laser diode pump; and a set of intra-cavity optical components uniquely configured per each laser beam of said multi-beam laser arranged within the single laser resonator.

In another aspect, an optically segmented composite gain medium is disclosed. Each segment of the composite gain medium functions as an optical waveguide for a respective pump light of a segmented laser diode pump array. Such an optically segmented composite gain medium comprises a. plurality of gain medium sections, each gain medium section being based on a selected gain material to function as an optical waveguide for the respective pump light; and separation regions defined by a region separating adjacent regions of said plurality of gain medium sections for optical isolation based on a material of lower refractive index. The lower index material forms each separation region.

Yet, in another aspect, a method of forming a single common laser resonator cavity is disclosed based on the optically segmented composite gain medium. Such a method comprises disposing two common surface mirrors that are based on an optically flat reflector such that a common surface mirror is commonly shared by all of the laser segments formed by the separate gain segments of the optically segmented composite gain medium and other optical components arranged in each laser segment; and angle-aligning said two common surface mirrors relative to each other to form the single common laser resonator cavity, an optical propagation axis through the resonator cavity being defined perpendicular to the mirrors. Each of the mirrors are flat within 1/20 of optical wavelength across the entire mirror surface.

BRIEF DESCRIPTION OF THE DRAWINGS

Additional advantages and features will become apparent as the subject invention becomes better understood by reference to the following detailed description when considered in conjunction with the accompanying drawings wherein.

DETAILED DESCRIPTION

An exemplary embodiment of a single laser is disclosed that generates emission in multiple beams, multiple wavelengths and temporal characteristics required for the various applications enumerated above. All of the beams are generated in a single laser resonant cavity and are inherently bore-sighted relative to each other, removing the need to individually align the output angles of the separate beams. The relative bore-sighting of the individual beams also makes it possible to use a single telescope to transmit all of the laser beams, without the use of beam combiner. Other aspects of the exemplary laser embodiment are that each of the multiple laser beams can be at a vastly different (from UV to mid-infrared) wavelength, pulse energy, pulse length, repetition rate and average power. The power and/or pulse energy of each laser beam can be separately controlled and turned on or off independently. Particularly, for some applications, such as eye-safe range-finding at 1550 nm, residual emission from the other lasers operating at other wavelengths could preclude eye-safe operation of the range-finder. Such characteristics of the disclosed multi-wavelength and multi-beam laser system are made possible by using an exemplary laser embodiment comprised of an optically segmented gain section, an optically segmented pump laser, and common surface segmented cavity mirrors.

Figure 1:
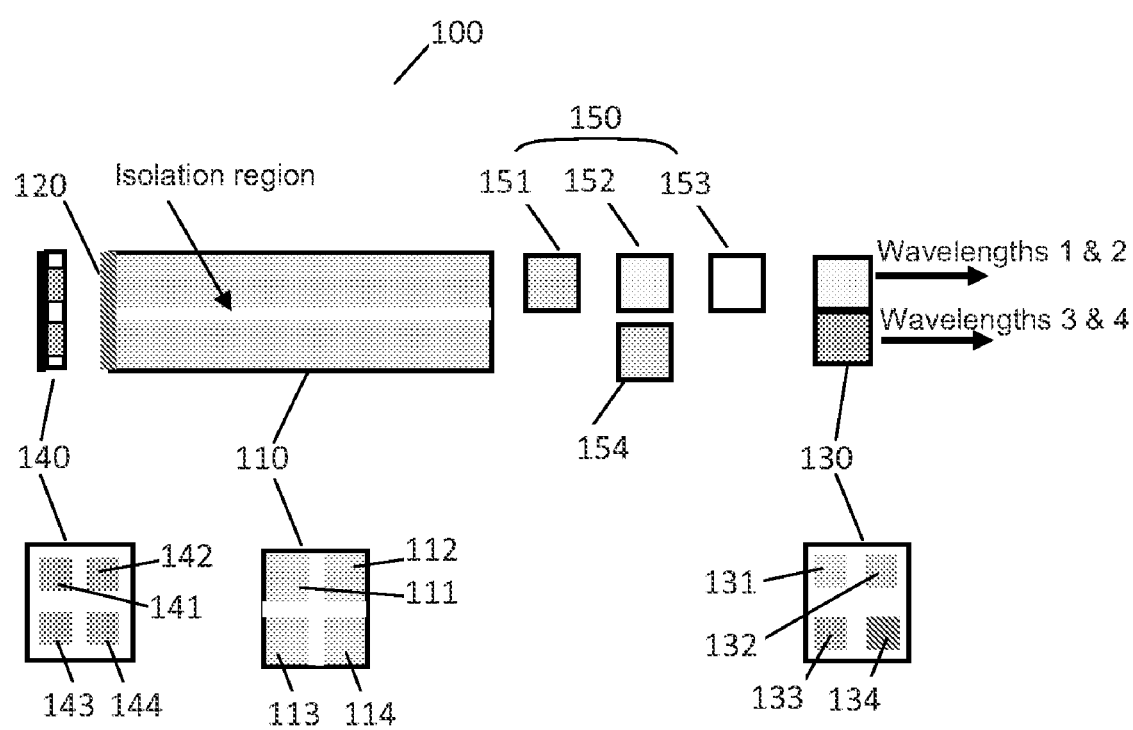
FIG. 1 shows an exemplary embodiment of a multi-wavelength, multi-beam laser, depicted as an exemplary side-view configuration, with a respective corresponding frontal view shown below selected elements.

The configuration of such an exemplary embodiment of a multi-wavelength, multi-beam laser is shown in FIG. 1. FIG. 1 shows an exemplary side-view configuration of the pertinent elements, with a respective corresponding frontal view shown below selected elements. The disclosed exemplary multi-wavelength, multi-beam laser embodiment 100 is comprised of the following elements:

1. Optically segmented, composite gain medium e.g., based on Nd:YAG) 110.
2. A single common laser resonator defined by common surface mirrors, at least one of the first common surface mirror 120 and the second common surface mirror 130 being configured as common surface segmented minors, a common surface segmented mirror (120 and/or 130) having segments (e.g., 131-134) with each segment having different reflectivity, both in magnitude and spectral dependence.
3. A segmented laser diode pump array 140, comprising individual electrically isolated segments that can be activated separately, and with each section (e.g., 141-144) selected to have a specific emission wavelength optimized for pumping the corresponding segment in the gain medium.
4. Multiple lasers arranged within the single laser resonator, each laser configured with a selected combination of intracavity optical components, e.g., Cr:YAG, non-linear crystal, polarizer, electro-optic Q-switches 151-154, optimized to generate a specific laser emission wavelength, pulse energy, average power, and pulse repetition frequency.

These key parts and their function will now be described,

1. Optically Segmented Gain Medium.

Figure 2:
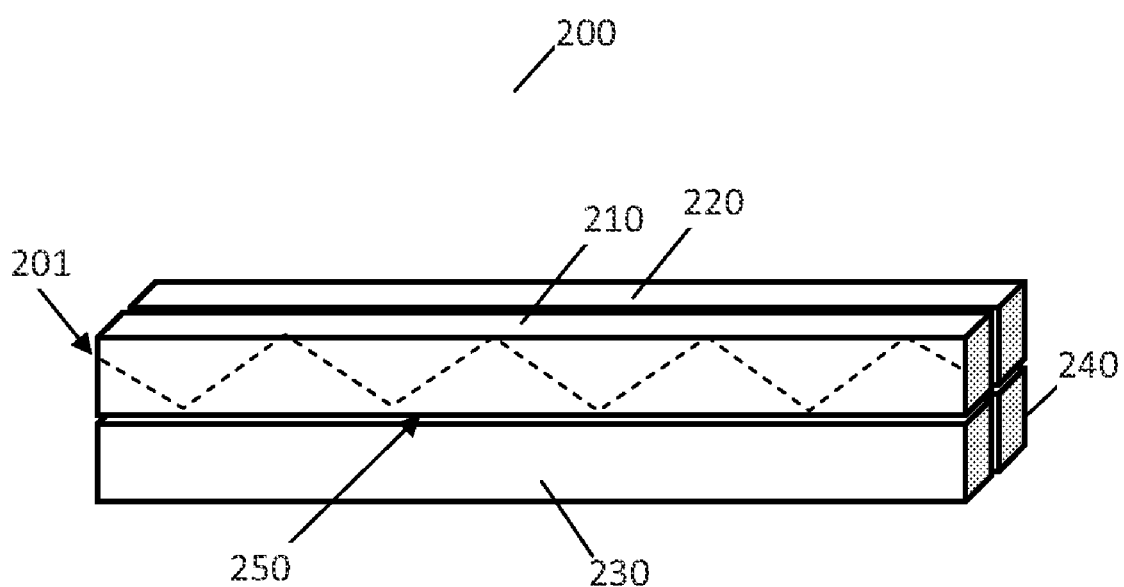
FIG. 2 shows exemplary gain medium with optically segmented, composite structure.

An exemplary gain medium 200 with optically segmented, composite structure is shown in FIG. 2. It is comprised of several gain medium sections (e.g., 210, 220, 230 and 240), separated by material of lower refractive index, the lower index material forming a separation/isolation region 250. The refractive index step between the gain material and the lower refractive index region causes all light below the critical angle to be reflected at the boundary. This allows each gain section (e.g., 210, 220, 230, 240) to function as an optical waveguide for the pump light (e.g., 201); pump light injected into each section is wave-guided along the section (e.g., 210, 220, 230 or 240), without coupling into the adjoining gain sections, isolating the pump light in that section from that in the other sections. The divergence angle of the pump light propagating in the waveguide is assumed to be smaller than the critical reflection angle defined by the refractive index difference between the gain medium (e.g., 210, 220, 230 or 240) and the lower refractive index material 250.

Figure 3A:
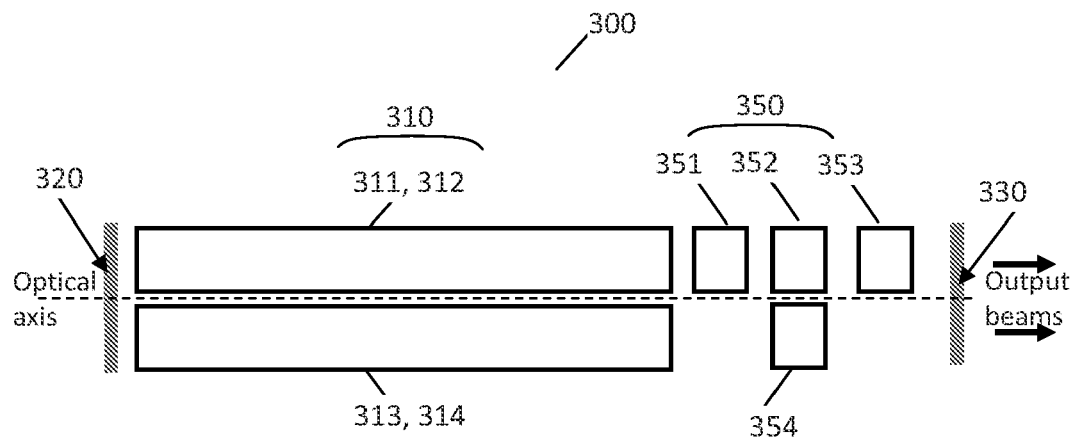
FIG. 3a shows an exemplary common laser resonator cavity defined by two common surface mirrors on separate substrates.
Figure 3B:
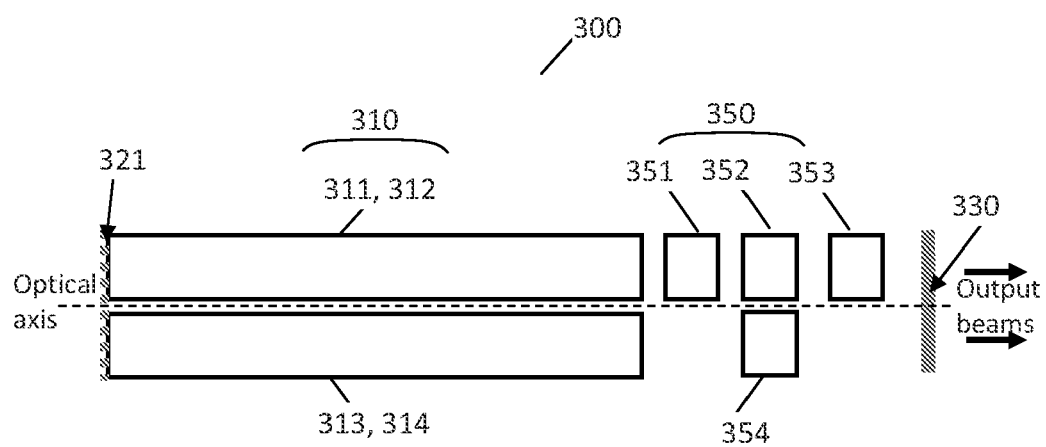
FIG. 3b shows an alternate exemplary common laser resonator cavity defined by two common surface mirrors, the first mirror having been deposited directly on the end facet of a multi-segment gain structure.

As an example, the composite structure (e.g., 200) can be made of slabs or rods of Nd:YAG, Yb:YAG, Nd:YVO, Nd:YLF, Er/Yb doped glass, Er:YAG, separated by lower index epoxy or bonding glass, resulting in a quasi-monolithic composite gain structure. With this approach, each section (e.g., 210, 220, 230 or 240) can be made of a different gain material. The multi-segment gain structure can also be made using a monolithic Nd:YAG ceramic material in which the higher index Nd-doped sections are surrounded by lower index un-doped YAG. Alternatively, another exemplary embodiment of a monolithic structure (e.g., 200) could be Er/Yb doped phosphate-silica glass rods surrounded by lower refractive index silica, glass. The end faces of both the quasi-monolithic and monolithic composite structures can be end-polished and optically coated as a single piece, simplifying the assembly. In addition, this technique will result in end-facets that are optically flat across all of the gain sections, so that a common surface laser cavity mirror (as explained below) can be directly deposited on the composite gain structure. In another aspect, an exemplary multi-segment gain medium structure (e.g., 200) can also be fabricated by attaching the individual rods to each other or surrounding mechanical support using by small spacers and allowing the remaining surfaces to be surrounded by air. The small spacers are preferably made out of low index material to prevent pump light leakage out of each gain section, or are sufficiently short that the leakage is negligibly 2. A Method for Forming A Single Common Laser Resonator An exemplary embodiment of a single common laser resonator cavity 300 is defined by two common surface mirrors (e.g., 320, 330), as shown in FIGS. 3a and 3b.

The exemplary laser resonator is formed by two flat mirrors (e.g., 320, 330 for FIG. 3a), precisely angle-aligned relative to each other to form an optical resonator. An optical propagation axis for the laser light inside the resonator cavity is defined by the mirrors (e.g., 320, 330), and is perpendicular to them. The "common surface" terminology refers to the fact that both mirrors (e.g., 320, 330) constitute an optically flat reflector that is common or shared by all of the laser segments formed by the separate gain segments (e.g., 311-314) and other optical components (e.g., combinations of intracavity optical components 351, 352, 353 and/or 354 of 350 as shown) arranged in each laser segment. The minors are typically flat within 1/20 of optical wavelength across the entire mirror surface. Since the flat mirror laser resonator 300 is common to all laser segments (e.g., 311-314), all of the laser beams propagate along the same optical axis in the laser and exit the laser cavity at same angle, ensuring that all of the multiple laser output beams are bore-sighted relative to each other. One of the common surface mirrors (first mirror in FIG. 3a or 3b) can be on a separate substrate 320 as shown in 3a, or alternatively, at least the first mirror can be deposited directly on the end facet 321 of a monolithic or semi-monolithic multi-segment gain structure 310, as shown in FIG. 3b.

3. Common Surface Segmented Minor

Figure 4:
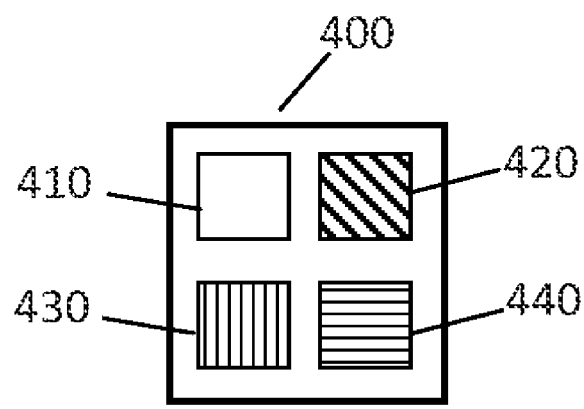
FIG. 4 shows an exemplary common surface laser resonator mirror having separate sections or segments.

One or both of the first and second common surface laser resonator mirrors can have separate sections or segments, as shown in FIG. 4, where such a mirror 400 is comprised of, e.g., four separate segments (410, 420, 430, 440).

The reflectivity and spectral characteristics of each minor segment (410, 420 430 or 440) can be individually optimized for each corresponding laser segment of the multi-wavelength laser. All of the mirror segments (e.g., 410, 420, 430, 440) are deposited on an optically flat surface of the mirror substrate (e.g., 400), so reflections from all segments will be co-aligned angle. This feature assures that a laser resonant cavity will be optimally aligned for all of the lasers simultaneously. For a typical laser resonator defined by two flat mirrors this requires a mirror angular alignment accuracy of approximately 100 micro-radians, a precision that can be achieved with well established laser fabrication procedures.

4. A Segmented Laser Diode Pump Array

Figure 5:
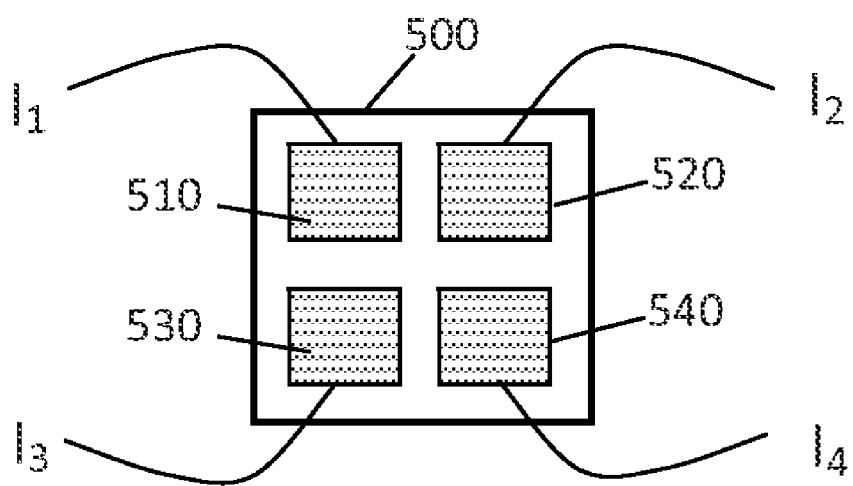
FIG. 5 shows an exemplary segmented laser diode pump array, shown as a 4-section array.

An exemplary embodiment of a segmented laser diode pump array 500 is comprised of several electrically isolated pump sections (e.g., 510, 520, 530, 540) that can be activated individually. Each section in the segmented laser diode array, such as a 4-section array 500 shown in FIG. 5, consists of a diode bar or a multi-bar stack, with all laser diodes mounted on a single common heat-sink All diode bars or diode stacks in an array section (510, 520, 530 or 540) are electrically isolated from those in other sections. This feature makes it possible to control the power output from each pump array section individually by controlling currents $I_1$, $I_2$, $I_3$, $I_4$ flowing through each of the four sections (510, 520, 530, 540), respectively. By this means each corresponding laser segment in the multi-wavelength laser of FIG. 3*a* or 3*b* can be activated separately.

If only one pump array segment is activated, the other pump array sections are in off, so that the corresponding laser segments of the multi-wavelength laser are not activated and do not generate any laser emission. If the various gain section are made of different gain medium, each section might require different pump wavelength. To accommodate this need, each segment (e.g., 510, 520, 530, 540) in the pump array 500 can be made with different semiconductor laser diode composition, so that each the emission wavelength of each is optimum for the corresponding laser segment in the multi-wavelength laser.

5. Multiple Lasers Arranged Within the Single Laser Resonator

Multiple laser segments are arranged within the multi-wavelength single laser resonator, as shown, e.g., in FIGS. 3*a* and 3*b*. Each laser segment e.g., 311, 312, 313 or 314) can be configured with a selected combination of: pump laser wavelength and power, gain medium, common surface mirror reflectivity, intra-cavity optical elements (e.g., 351-354). The specific combination of these components (an exemplary configuration of intra-cavity optical elements being referenced as 350) is chosen to generate a desired laser emission wavelength, pulse energy, average power, and temporal characteristics of pulse repletion frequency and pulse length. The intra-cavity optical elements comprising an exemplary configuration of intra-cavity optical elements 350 can include, but are not limited to: a Q-switch, which can be either a saturable absorber such as Cr:YAG for passive Q-switching, or an electro-optical crystal such as $LiNO_3$ for active Q-switching; polarizer for defining the polarization state of the laser emission; a non-linear crystal for frequency conversion, such as a KTP crystal for frequency doubling of 1064 nm emission, or a KTP crystal for a Optical Parametric Oscillator (OPO) for converting 1064 rim emission to 1560 nm eye-safe emission wavelength or 3.3 μm mid-IR emission; spectrally selective filters to define the laser emission wavelength; apertures to select spatial modes of the laser.

It is obvious that many modifications and variations of the present invention are possible in light of the above teachings. It is therefore to be understood that within the scope of the appended claims, the invention may be practiced otherwise than as described.

What is claimed is:

1. A compact multi-wavelength and mufti-beam laser, comprising:
    an optically segmented composite gain medium;
    a single common laser resonator defined by a first common surface mirror and a second common surface mirror, at least one of said common surface mirrors being configured as a common surface segmented mirror;
    a segmented laser diode pump; and
    a set of intra-cavity optical components uniquely configured per each laser beam of said multi-beam laser arranged within the single common laser resonator.

2. The compact multi-wavelength and multi-beam laser recited in claim 1, wherein said optically segmented composite gain medium is based on Nd:YAG.

3. The compact multi-wavelength and multi-beam laser recited in claim 1, wherein said common surface segmented mirror has segments, each segment having different reflectivity, both in magnitude and spectral dependence.

4. The compact multi-wavelength and multi-beam laser recited in claim 1, wherein said segmented laser diode pump is based on an array comprising individual electrically isolated segments that can be activated separately, and wherein each segment is capable of emitting a emission wavelength specific to the respective segment, optimized for pumping the corresponding segment in the gain medium.

5. The compact multi-wavelength and multi-beam laser recited in claim 1, wherein each set of intra-cavity optical components is uniquely configured based on one or more of intra-cavity optical components chosen from a group consisting of a Q-switch, which can be either a saturable absorber such as Cr:YAG for passive Q-switching, or an electro-optical crystal such as $LiNbO3$ for active Q-switching; a polarizer for defining the polarization state of the laser emission; a non-linear crystal for frequency conversion, such as a KTP crystal for frequency doubling of 1064 nm emission, or a KTP crystal for a Optical Parametric Oscillator for converting 1064 nm emission to 1560 nm eye-safe emission wavelength or 3.3 μm mid-IR emission; spectrally selective filters to define the laser emission wavelength; and apertures to select spatial modes of the laser, said set of intra-cavity optical components being configured to generate a specific laser emission wavelength, pulse energy, average power, and pulse repetition frequency.

6. The compact multi-wavelength and multi-beam laser recited in claim 1, wherein said multi-beam laser is generated in a single common laser resonant cavity, each laser beam being bore-sighted relative to each other, removing the need to individually align the output angles of the separate beams.

7. The compact multi-wavelength and multi-beam laser recited in claim 1, wherein power and/or pulse energy of each laser beam can be independently controlled, independently enabled/disabled, and independently configured with respect to laser wavelength, pulse energy, pulse length, repetition rate and/or average power.

8. The compact multi-wavelength and multi-beam laser recited in claim 1, wherein for a given laser beam emission for eye-safe range-finding at 1550 nm, residual emissions from the other laser beams can be configured to operate at other wavelengths, precluding eye-safe operation of the range-finder.

* * * * *